(12) United States Patent
Koike

(10) Patent No.: US 10,015,918 B2
(45) Date of Patent: Jul. 3, 2018

(54) FEEDER AND MOUNTING MACHINE

(71) Applicant: FUJI MACHINE MFG. CO., LTD., Chiryu-shi (JP)

(72) Inventor: Hirokazu Koike, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 245 days.

(21) Appl. No.: 14/891,764

(22) PCT Filed: Jun. 4, 2013

(86) PCT No.: PCT/JP2013/065459
§ 371 (c)(1),
(2) Date: Nov. 17, 2015

(87) PCT Pub. No.: WO2014/196018
PCT Pub. Date: Dec. 11, 2014

(65) Prior Publication Data
US 2016/0128247 A1    May 5, 2016

(51) Int. Cl.
*H05K 13/04*     (2006.01)
*B65H 20/00*    (2006.01)
*H05K 13/08*     (2006.01)

(52) U.S. Cl.
CPC ......... *H05K 13/0417* (2013.01); *B65H 20/00* (2013.01); *H05K 13/08* (2013.01)

(58) Field of Classification Search
CPC .... H05K 13/02; H05K 13/04; H05K 13/0417; H05K 13/0452; H05K 13/0478;
(Continued)

(56) References Cited

U.S. PATENT DOCUMENTS 5,930,140 A * 7/1999 Asai ................. H05K 13/02
29/783
2006/0196045 A1   9/2006 Swab

FOREIGN PATENT DOCUMENTS

JP   2009 123892   6/2009

OTHER PUBLICATIONS

Extended European Search Report dated Jul. 29, 2016 in Patent Application No. 13886477.2.
(Continued)

*Primary Examiner* — Peter DungBa Vo
*Assistant Examiner* — Joshua D Anderson
(74) *Attorney, Agent, or Firm* — Oblon, McClelland, Maier & Neustadt, L.L.P.

(57) ABSTRACT

A feeder, which is used through installation in a mounting machine and which is configured to supply components that a mounting machine mounts on a printed circuit board. The feeder is a second type of feeder which is capable of performing a second aspect component supply operation, and is interchangeable with a first type of feeder which performs a first aspect component supply operation. The feeder is configured to transmit feeder information indicating that the feeder is the first type of feeder and perform the first aspect component supply operation when a request for feeder information is received from the mounting machine by a first command, and transmit feeder information indicating that the feeder is the second type of feeder and perform the second aspect component supply operation when a request for feeder information is received from the mounting machine by a second command.

8 Claims, 4 Drawing Sheets

(58) Field of Classification Search
CPC .............. H05K 13/08; Y10T 29/43004; Y10T 29/53039; Y10T 29/53061; Y10T 29/53178; Y10T 29/53252; Y10T 29/53313
See application file for complete search history.

(56) References Cited

OTHER PUBLICATIONS

International Search Report dated Jul. 23, 2013 in PCT/JP2013/065459 filed Jun. 4, 2013.

* cited by examiner

FEEDER AND MOUNTING MACHINE

TECHNICAL FIELD

The present description relates to a feeder, which is used through installation in a mounting machine and which is configured to supply components that a mounting machine mounts on a printed circuit board, and a mounting machine in which a feeder is installed and which is configured to mount components that are supplied by the feeder on a printed circuit board.

BACKGROUND ART

JP-A-2009-123892 discloses a feeder, which is used through installation in a mounting machine and which is configured to supply components that a mounting machine mounts on a printed circuit board, and a mounting machine in which a feeder is installed and which is configured to mount components that are supplied by a feeder on a printed circuit board. In the technology of PTL 1, it is determined whether a current version of a feeder and a required version that is required for the feeder match, and a user is notified of the Summary Research and development of feeders is constantly progressing, and by improving conventional feeders, it may be possible to provide more high-efficiency feeders. As high-efficiency feeders are developed, it is desirable for supplier of the feeders to terminate production of old model feeders used in before, and replace the production system so that only high-efficiency, new model feeders are produced. However usually, conventional mounting machines are compatible only with the conventional feeders, and are not compatible with newly developed feeders. Therefore, if the supplier of feeders terminate production of conventional feeders, there is a concern that the convenience of users that will continue to use the conventional mounting machines will be affected.

In addition, when supplier of mounting machines provide new mounting machines that are compatible with newly developed feeders, if the new mounting machines are not compatible with the conventional feeders, the convenience of users that will continue to use the conventional feeders, will be affected.

The present description discloses a technology that solves the above-mentioned problem. The present description discloses a feeder and a mounting machine that can substitute for the conventional feeders and the conventional mounting machines without affecting the convenience of users.

The present description discloses a feeder, which is used through installation in a mounting machine and which is configured to supply components that a mounting machine mounts on a printed circuit board. The feeder is a second type of feeder which is capable of performing a second aspect component supply operation, and is interchangeable with a first type of feeder which performs a first aspect component supply operation. The feeder is configured to transmit feeder information indicating that the feeder is the first type of feeder and perform the first aspect component supply operation when a request for feeder information is received from the mounting machine by a first command, and transmit feeder information indicating that the feeder is the second type of feeder and perform the second aspect component supply operation when a request for feeder information is received from the mounting machine by a second command.

According to the above-mentioned feeder, it is possible to perform the first aspect component supply operation as a result of installation in a mounting machine that is compatible with the first type of feeder, and it is also possible to perform the second aspect component supply operation as a result of installation in a mounting machine that is compatible with the second type of feeder. Therefore, it is possible to substitute for the conventional feeder without affecting the convenience of users.

The present description also discloses a mounting machine in which a feeder is installed and which is configured to mount components that are supplied by the feeder on a printed circuit board. The mounting machine is capable of installing either one of a first type of feeder which transmits feeder information indicating that the feeder is the first type of feeder and performs the first aspect component supply operation when a request for feeder information is received from the mounting machine by a first command, and a second type of feeder which transmits feeder information indicating that the feeder is the second type of feeder and performs the second aspect component supply operation when a request for feeder information is received from the mounting machine by a second command. When a feeder is installed, the mounting machine is configured to perform a request for feeder information to the feeder by the second command and perform a second aspect component mounting operation corresponding to the second aspect component supply operation of the feeder when feeder information indicating that the feeder is the second type of feeder is received from the feeder, and perform a request for feeder information to the feeder by the first command in a case in which feeder information indicating that the feeder is the second type of feeder is not received from the feeder, and perform a first component mounting operation corresponding to the first aspect component supply operation of the feeder when feeder information indicating that the feeder is the first type of feeder is received from the feeder.

According to the above-mentioned mounting machine, it is possible to perform the first component mounting operation that corresponds to the first aspect component supply operation of a feeder as a result of installing the first type of feeder, and it is also possible to perform the second component mounting operation that corresponds to the second aspect component supply operation of a feeder as a result of installing the second type of feeder. Therefore, it is possible to substitute for the conventional mounting machine without affecting the convenience of users.

DESCRIPTION OF EMBODIMENTS

Example

Figure 1:
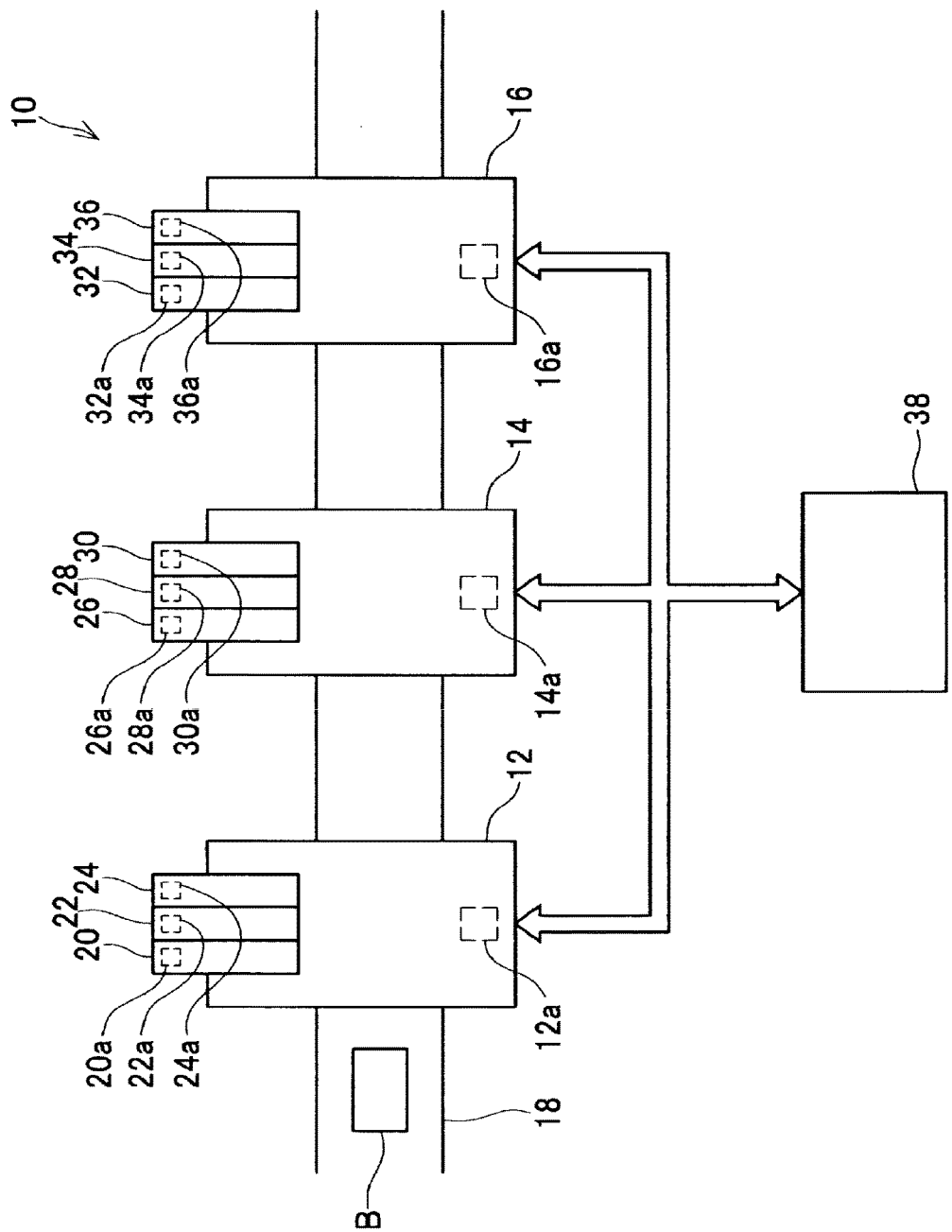
FIG. 1 is a diagram that schematically shows a configuration of a component mounting system 10 of an Example.

FIG. 1 schematically shows a configuration of a component mounting system 10 of an Example. The component mounting system 10 is provided with a plurality of mounting machines 12, 14 and 16, and a conveyance pathway 18 that conveys a circuit board B so as to pass through the respective mounting machines 12, 14 and 16 in order. In the example that is shown in the figure, a case in which component mounting system 10 is provided with three mounting machines is shown, but the number of mounting machines is not limited to this. The respective mounting machines 12, 14 and 16 are provided with mounting machine controllers 12a, 14a and 16a for controlling the operations of each type of constituent element.

A plurality of feeders 20, 22 and 24 are installed in the mounting machine 12. In the same manner, a plurality of feeders 26, 28 and 30 are installed in the mounting machine 14, and a plurality of feeders 32, 34 and 36 are installed in the mounting machine 16. In the example that is shown in the figure, a case in which three feeders are installed in the respective mounting machines 12, 14 and 16, but the number of feeders that are installed in the mounting machines is not limited to this. The feeders 20, 22, 24, 26, 28, 30, 32, 34 and 36 are provided with feeder controllers 20a, 22a, 24a, 26a, 28a, 30a, 32a, 34a and 36a for controlling the operations of each constituent element. When the feeders 20, 22 and 24 are installed in the mounting machine 12, the feeder controllers 20a, 22a and 24a are capable of communicating with the mounting machine controller 12a. In the same manner, when the feeders 26, 28 and 30 are installed in the mounting machine 14, the feeder controllers 26a, 28a and 30a are capable of communicating with the mounting machine controller 14a, and when the feeders 32, 34 and 36 are installed in the mounting machine 16, the feeder controllers 32a, 34a and 36a are capable of communicating with the mounting machine controller 16a.

The respective feeders 20, 22, 24, 26, 28, 30, 32, 34 and 36 supply components that are to be mounted on the circuit board B to the mounting machines 12, 14 and 16. The feeders 20, 22, 24, 26, 28, 30, 32, 34 and 36 in the present Example are, for example, tape feeders that feed a predetermined feeding amount of tape, to which components are affixed at predetermined intervals, in order at a predetermined feeding speed as a result of drive of a servomotor.

The mounting machines 12, 14 and 16 are configured to pick up the components supplied from the installed feeders 20, 22, 24, 26, 28, 30, 32, 34 and 36 and mount onto the circuit board B by using a head for component mounting (not illustrated).

The mounting machine controllers 12a, 14a and 16a of the mounting machines 12, 14 and 16 are capable of communicating with a production management computer 38. The production management computer 38 controls the operations of the mounting machines 12, 14 and 16, the feeders 20, 22, 24, 26, 28, 30, 32, 34 and 36, the conveyance pathway 18 and the like.

In the component mounting system 10 of the present Example, it is possible to use a first type of mounting machine as the mounting machines 12, 14 and 16, and it is also possible to use a second type of mounting machine. In the present Example, the first type of mounting machine is an old model mounting machine used in before, and the second type of mounting machine is a new model mounting machine that can be used in place of the first type of mounting machine.

In addition, in the component mounting system 10 of the present Example, as the feeders 20, 22, 24, 26, 28, 30, 32, 34 and 36, it is possible to use a first type of feeder, and it is also possible to use a second type of feeder. In the present Example, the first type of feeder is an old model feeder used in before, and the second type of feeder is a new model feeder that can be used in place of the first type of feeder.

The first type of feeder transmits feeder information, which indicates that the feeder is the first type of feeder, to the mounting machine when a request for feeder information is received from the mounting machine by a first command. Thereafter, the first type of feeder supplies components to the mounting machine by performing a first aspect component supply operation. In the present Example, in the first aspect component supply operation, a component supply operation to the mounting machine is performed by feeding the tape, to which the component is affixed, at a predetermined feeding speed (a first feeding speed). The first type of feeder transmits an abnormal response to the mounting machine when a request for feeder information is received by a command other than the first command.

The second type of feeder transmits feeder information, which indicates that the feeder is the second type of feeder, to the mounting machine when a request for feeder information is received from the mounting machine by a second command. Thereafter, the second type of feeder supplies components to the mounting machine by performing a second aspect component supply operation. In the present Example, in the second aspect component supply operation, a component supply operation to the mounting machine is performed by feeding the tape, to which the component is affixed, at a predetermined feeding speed (a second feeding speed) that is faster than the first feeding speed. In addition, the second type of feeder transmits feeder information, which indicates that the feeder is the first type of feeder, to the mounting machine when a request for feeder information is received from the mounting machine by the first command. Thereafter, the second type of feeder supplies components to the mounting machine by performing the first aspect component supply operation, that is, by feeding the tape, to which the component is affixed, at the first feeding speed.

The first type of mounting machine performs a request for feeder information to a feeder by the first command when the feeder is installed. Thereafter, when feeder information, which indicates that the feeder is the first type of feeder, is received from the feeder, the first type of mounting machine performs a first aspect component mounting operation that corresponds to first aspect component supply operation of the feeder. In the first aspect component mounting operation, picking up of the component and mounting of the component on the circuit board B by the head are performed to match the operation of the feeder that supplies the component at the first feeding speed.

The second type of mounting machine, firstly, performs a request for feeder information to a feeder by the second command when the feeder is installed. Thereafter, when feeder information, which indicates that the feeder is the second type of feeder, is received from the feeder, the second type of mounting machine performs a second aspect component mounting operation that corresponds to second aspect component supply operation of the feeder. In the second aspect component mounting operation, picking up of the component and mounting of the component on the circuit board B by the head are performed to match the operation of the feeder that supplies the component at the second feeding speed. Therefore, in the second aspect component mounting operation, in comparison with the first aspect component mounting operation, the picking up operation of the component by the head is faster, and therefore, a cycle time of the component mounting operation is shorter. In a case in which feeder information, which indicates that the feeder is the second type of feeder, is not received from the feeder, the second type of mounting machine subsequently performs a request for feeder information to the feeder by the first command. Thereafter, when feeder information, which indicates that the feeder is the first type of feeder, is received from the feeder, the second type of mounting machine performs the first aspect component mounting operation that corresponds to the first aspect component supply operation of the feeder.

Figure 2:
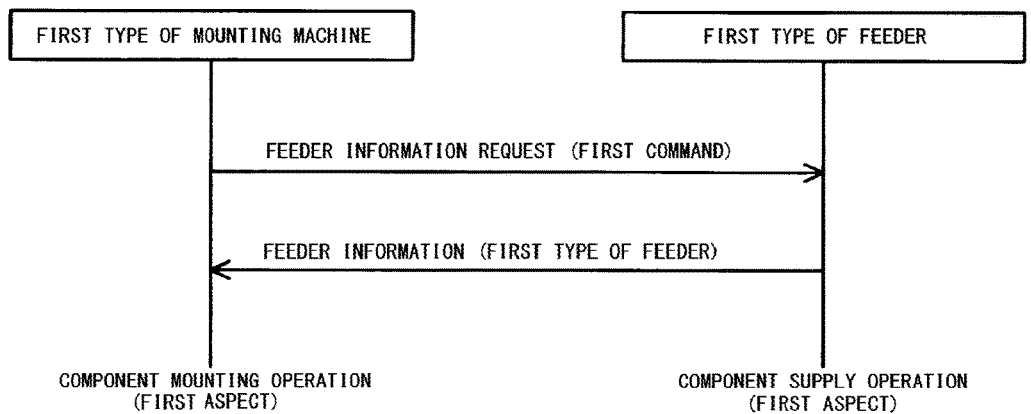
FIG. 2 is a diagram that shows a summary of operations of a mounting machine and a feeder in a case in which a first type of feeder is installed in a first type of mounting machine.

As shown in FIG. 2, in a case in which the first type of feeder is installed in the first type of mounting machine, a request for feeder information to the feeder is performed by the mounting machine with the first command. Further, feeder information, which indicates that the feeder is the first type of feeder, is transmitted from the feeder to the mounting machine. Thereafter, the feeder performs the first aspect component supply operation, and the mounting machine performs the first aspect component mounting operation that corresponds to the first aspect component supply operation.

Figure 3:
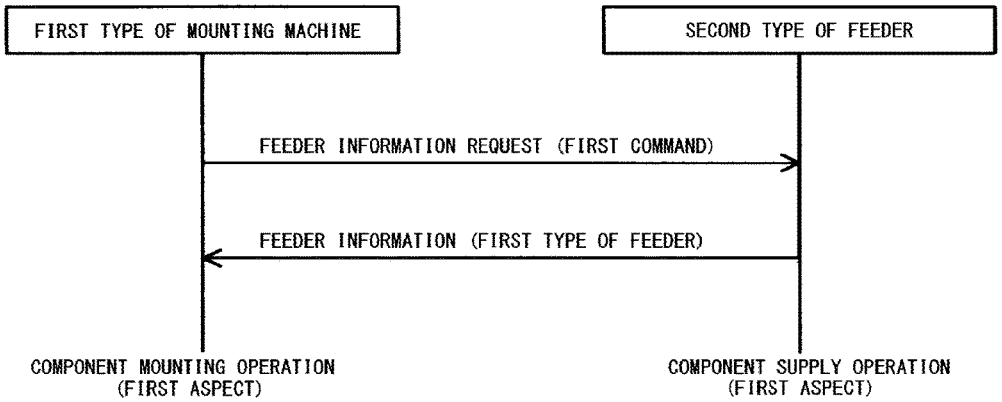
FIG. 3 is a diagram that shows a summary of operations of the mounting machine and a feeder in a case in which a second type of feeder is installed in the first type of mounting machine.

As shown in FIG. 3, in a case in which the second type of feeder is installed in the first type of mounting machine, a request for feeder information to the feeder is performed by the mounting machine with the first command. Further, feeder information, which indicates that the feeder is the first type of feeder, is transmitted from the feeder to the mounting machine. Thereafter, the feeder performs the first aspect component supply operation, and the mounting machine performs the first aspect component mounting operation that corresponds to the first aspect component supply operation.

Figure 4:
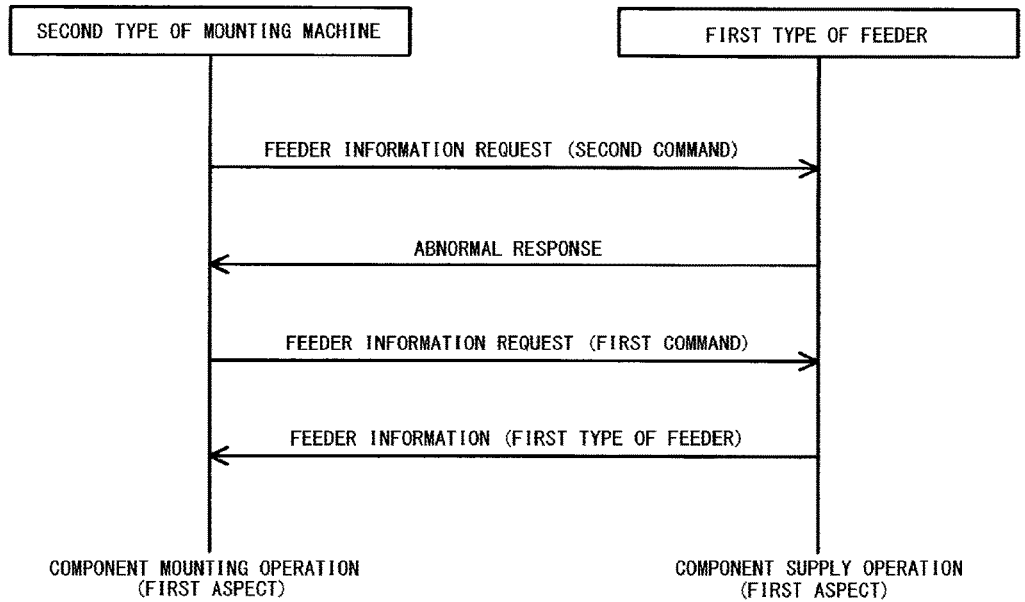
FIG. 4 is a diagram that shows a summary of operations of a mounting machine and the feeder in a case in which the first type of feeder is installed in a second type of mounting machine.

As shown in FIG. 4, in a case in which the first type of feeder is installed in the second type of mounting machine, firstly, a request for feeder information to the feeder is performed by the mounting machine with the second command. Further, an abnormal response is transmitted from the feeder to the mounting machine. Subsequently, a request for feeder information is performed to the feeder by the mounting machine with the first command. Further, feeder information, which indicates that the feeder is the first type of feeder, is transmitted from the feeder to the mounting machine.

Thereafter, the feeder performs the first aspect component supply operation, and the mounting machine performs the first aspect component mounting operation that corresponds to the first aspect component supply operation.

Figure 5:
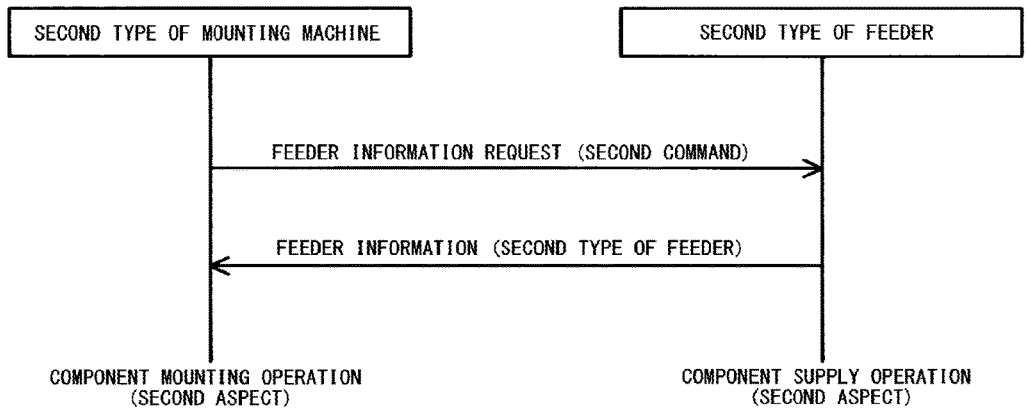
FIG. 5 is a diagram that shows a summary of operations of the mounting machine and the feeder in a case in which the second type of feeder is installed in the second type of mounting machine.

As shown in FIG. 5, in a case in which the second type of feeder is installed in the second type of mounting machine, firstly, a request for feeder information to the feeder is performed by the mounting machine with the second command. Further, feeder information, which indicates that the feeder is the second type of feeder, is transmitted from the feeder to the mounting machine. Thereafter, the feeder performs the second aspect component supply operation, and the mounting machine performs the second aspect component mounting operation that corresponds to the second aspect component supply operation.

In the above-mentioned manner, in the component mounting system of the present Example, it is possible to install and use the first type of feeder in the first type of mounting machine used in before, and it is also possible to install and use the second type of feeder. Therefore, even supposing a case in which a supplier of a component mounting system terminates production of the first type of feeder to produce only the second type of feeder, there is no effect on the convenience of a user that continues to use the first type of mounting machine.

According to the component mounting system of the present Example, it is possible to install the first type of feeder used in before, in the second type of mounting machine, and it is also possible to install the second type of feeder. Therefore, even in a case in which the first type of mounting machine is substituted with the second type of mounting machine, it is possible to continue to use the first type of feeder used in the before, without change. In addition, by installing the second type of feeder in the second type of mounting machine, it is possible to realize faster component mounting than that of the conventional models.

Additionally, the first command and the second command may be different commands that are transmitted with the same communication method, and may be commands that are transmitted with different communication methods. For example, the first command may be a command that is transmitted using a communication method that is not encrypted, and the second command may be transmitted using a communication method that is encrypted.

In the component mounting system 10 of the present Example, as a result of the production management computer 38 executing a component mounting optimization (optimizer) program, a production plan is created in the component mounting system 10. The type of component that is supplied by the feeders 20, 22, 24, 26, 28, 30, 32, 34 and 36, the component supply operations that should be performed by the feeders 20, 22, 24, 26, 28, 30, 32, 34 and 36, and the component mounting operations that should be performed by the mounting machines 12, 14 and 16 are designated in the production plan that is created by the production management computer 38.

According to the component mounting system 10 of the present Example, when the production management computer 38 creates the production plan using the optimization program, it is possible for a user to select either a mode that prioritizes and designates a first operation state, in which the feeder performs the first aspect component supply operation and the mounting machine performs the first aspect component mounting operation, or a mode that prioritizes and designates a second operation state, in which the feeder performs the second aspect component supply operation and the mounting machine performs the second aspect component mounting operation. In the component mounting system 10 of the present Example, in order to realize the second operation state, the second type of mounting machine and the second type of feeder are necessary. However, in a case in which a user does not possess both the second type of mounting machine and the second type of feeder, it is not possible to realize the second operation state. In the above-mentioned manner, by configuring so that it is possible for a user to select a mode that prioritizes and designates the first operation state, or a mode that prioritizes and designates the second operation state, it is possible to create a production plan that matches the information of a mounting machine and a feeder that the user possesses. Additionally, configuration may be made such that it is possible to perform the above-mentioned selection of modes depending on forms of feeder. For example, in a case in which the feeder is a tape feeder, it is possible to configure such that it is possible for a user to select so that, regarding a feeder in which the tape width is 12 mm, a mode which prioritizes and designates the second operation state is set, and regarding a feeder in which the tape width is 8 mm or 16 mm, a mode which prioritizes and designates the first operation state is set.

Figure 6:
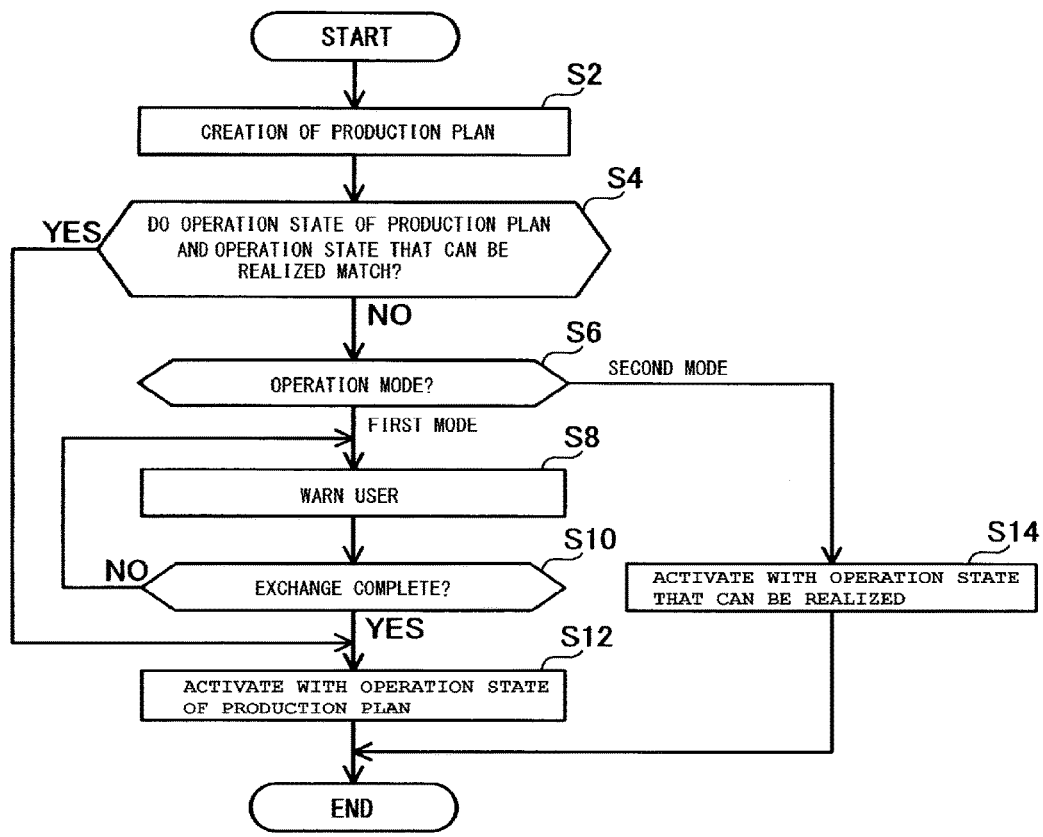
FIG. 6 is a flowchart that describes a switching process between a first operation mode, which prioritizes an operation state that is designated by production planning, and a second operation mode, which prioritizes an operation state that can be realized.

In the component mounting system 10 of the present Example, it is possible to switch between the first operation mode that prioritizes an operation state of a combination of a feeder and a mounting machine that are designated by a production plan, and the second operation mode that prioritizes an operation state that can be realized by a current feeder and a mounting machine. Hereinafter, each mode will be described with reference to the flowchart of FIG. 6.

In Step S2, the production management computer 38 creates a production plan, and in Step S4, the production management computer 38 determines whether or not an operation state that is designated by the production plan matches an operation state that can be realized by a combination of a current feeder and mounting machine. Information of a combination of the current feeder and mounting machine is transmitted from the mounting machine controllers 12*a*, 14*a* and 16*a* to the production management computer 38. In a case in which an operation state that is designated by the production plan matches an operation state that can be realized by a combination of a current feeder and mounting machine (YES in Step S4), the process proceeds to Step S12, and instructions are transmitted from the production management computer 38 to the mounting machine controllers 12*a*, 14*a* and 16*a* in a manner that activates the feeder and the mounting machine with the operation state that is designated by the production plan.

In a case in which an operation state that is designated by the production plan does not match an operation state that can be realized (NO in Step S4), the process proceeds to Step S6, and the production management computer 38 determines whether either the first operation mode, which prioritizes an operation state that is designated by the production plan, or the second operation mode, which prioritizes an operation state that can be realized, is selected.

In Step S6, in a case in which the first operation mode is selected, the process proceeds to Step S8, and the production management computer 38 prompts a user to exchange the feeder and the mounting machine by emitting a warning. In Step S10, the production management computer 38 stands by until exchange of the feeder and the mounting machine has been carried out. When exchange of the feeder and the mounting machine is carried out, the fact that exchange has been carried out is transmitted to the production management computer 38 from the mounting machine controllers 12*a*, 14*a* and 16*a*. When exchange of the feeder and the mounting machine is carried out by a user (when YES is attained in Step S10), the process proceeds to Step S12, and instructions are transmitted from the production management computer 38 to the mounting machine controllers 12*a*, 14*a* and 16*a* in a manner that activates the feeder and the mounting machine with the operation state that is designated by the production plan. In this manner, by activating the component mounting system 10 with first operation mode, it is possible to perform component mounting work on the circuit board B according to the production plan that was created by the optimization program, and therefore, it is possible to reduce a calculation error between an expected cycle time and a current cycle time.

In Step S6, in a case in which the second operation mode is selected, the process proceeds to Step S14, and instructions are transmitted from the production management computer 38 to the mounting machine controllers 12*a*, 14*a* and 16*a* in a manner that activates the feeder and the mounting machine with the operation state that can be realized with the combination of the current feeder and mounting machine. In this case, the current cycle time is different from a cycle time that was expected from the production plan. However, it is possible to perform component mounting work on the circuit board B by taking full advantage of an existing feeder and mounting machine of a user.

Additionally, in a case in which the second operation mode is selected, it is possible to configure the component mounting system 10 so that the production management computer 38 recreates the production plan. In this case, when the production management computer 38 recreates the production plan using the optimization program, an operation state that can be realized with the combination of the current feeder and mounting machine is prioritized and designated. Thereafter, as a result of transmitting instructions from the production management computer 38 to the mounting machine controllers 12*a*, 14*a* and 16*a* in a manner that activates the feeder and the mounting machine with the operation state that is designated by the recreated production plan, it is possible to perform component mounting work on the circuit board B according to the production plan, and therefore, it is possible to reduce a calculation error between an expected cycle time and a current cycle time.

In addition, at a time point at which the first operation mode is selected, and the production management computer 38 has emitted a warning that prompts a user to exchange the feeder and the mounting machine in Step S8, the component mounting system 10 may be configured so that it is possible for the user to switch from the first operation mode to the second operation mode. At this time, in the second operation mode after switching, the production management computer 38 may activate the feeder and the mounting machine with an operation state that can be realized with the combination of the current feeder and mounting machine in the manner of Step S14, or, as described above, the production management computer 38 may recreate the production plan to match an operation state that can be realized by the combination of the current feeder and mounting machine.

Additionally, apart from the creation (and the recreation) of the production plan, the component mounting system 10 may be configured so that each of the mounting machine controller 12*a*, 14*a* and 16*a* performs the processes that the production management computer 38 performs in the above-mentioned present Example.

A representative and nonlimiting specific example has been described in detail with reference to the drawings. The detailed description is merely intended to indicate the details for implementing a preferred example of the present disclosure to persons skilled in the art, and is not intended to limit the scope of the present disclosure. In addition, the additional features that are disclosed can be used separately or together with other features in order to provide a further improved feeder and mounting machine.

In addition, the combination of the features and steps that are disclosed by the above-mentioned detailed description are not essential when implementing the present disclosure in the broadest sense, and in particular, are merely disclosed in order to describe a specific representative example of the present disclosure. Furthermore, the various features of the above-mentioned specific representative example and the various features of the elements that are set forth in the claims need not necessarily be combined in the manner of the specific example that is disclosed herein, or in the sequence exemplified when providing an additional or effective embodiment of the present disclosure.

In addition to the configurations of the features that are disclosed in Examples and/or the claims, all of the features that are disclosed in the present description and/or the claims are intended to be disclosed separately and in a mutually independent manner as limitations with respect to the specific matters that are disclosed in the originally filed disclosure and the claims. Furthermore, all of the disclosures that relate to numerical ranges and groups or collectives are intended to disclose their intermediate configurations as limitations with respect to specific matters that are disclosed in the originally filed disclosure and the claims.

Specific examples have been described in detail above, but these are merely indications of examples, and do not limit the scope of the claims. In the technology that is disclosed in the claims, examples in which the specific examples that are illustrated above are modified and changed in various manners are included. The technical elements that are disclosed in the present description and drawings exhibit technological effectiveness either individually or in various combinations, and are not limited to the combinations that are disclosed in the claims at the time of filing. In addition, the technology that is illustrated by way of example in the present description and drawings simultaneously achieves multiple objectives, and are effective as a result of achieving one among those objectives.

The invention claimed is:

1. A component feeder, which is used through installation in a mounting machine and which is configured to supply components that the mounting machine mounts on a printed circuit board, wherein the component feeder is a second type of feeder configured to perform a first aspect component supply operation and perform a second aspect component supply operation different from the first aspect component supply operation and wherein the second type of feeder is different from a first type of feeder configured to perform the first aspect component supply operation,
the component feeder comprising:
a controller configured to:
receive a request for feeder information from the mounting machine, wherein the request for feeder information can be a first command or a second command different from the first command and wherein the first command corresponds to the first aspect component supply operation and a corresponding first aspect component mounting operation of the mounting machine and the second command corresponds to the second aspect component supply operation and a corresponding second aspect component mounting operation of the mounting machine,
transmit feeder information indicating that the component feeder is the first type of feeder, even though the component feeder is the second type of feeder, and cause the component feeder to perform the first aspect component supply operation when the request for feeder information is the first command, and
transmit feeder information indicating that the component feeder is the second type of feeder and cause the component feeder to perform the second aspect component supply operation when the request for feeder information is the second command.

2. The component feeder according to claim 1, wherein the second type of feeder is a new model feeder configured to be used in the place of the first type of feeder.

3. The component feeder according to claim 1, wherein a feeding speed of the second aspect component supply operation is faster than a feeding speed of the first aspect component supply operation.

4. A component mounting machine in which a component feeder is installed and which is configured to mount components that are supplied by the component feeder on a printed circuit board, wherein the component mounting machine is configured to perform a first aspect component mounting operation and a second aspect component mounting operation and wherein the component feeder installed in the mounting machine is either one of (1) a first type of feeder which transmits feeder information indicating that the component feeder is the first type of feeder and performs a first aspect component supply operation when a first command for feeder information corresponding to the first aspect component supply operation and the first aspect component mounting operation is received by the first type of feeder from the component mounting machine and (2) a second type of feeder, different from the first type of feeder, which transmits feeder information indicating that the component feeder is the second type of feeder and performs a second aspect component supply operation when a second command for feeder information corresponding to the second aspect component supply operation and the second aspect component mounting operation, different from the first command for feeder information, is received by the second type of feeder from the component mounting machine,
the component mounting machine comprising:
a controller configured to, when the component feeder is installed:
send the second command for feeder information to the component feeder,
cause the component mounting machine to perform the second aspect component mounting operation corresponding to the second aspect component supply operation of the component feeder when the feeder information indicating that the component feeder is the second type of feeder is received from the component feeder,
send the first command for feeder information to the component feeder when the feeder information indicating that the component feeder is the second type of feeder is not received from the component feeder, and
cause the mounting machine to perform the first aspect component mounting operation corresponding to the first aspect component supply operation when the feeder information indicating that the component feeder is the first type of feeder is received from the component feeder.

5. The component mounting machine according to claim 4, wherein the second type of feeder is a new model feeder configured to be used in the place of the first type of feeder.

6. The component mounting machine according to claim 4, wherein a feeding speed of the second aspect component supply operation is faster than a feeding speed of the first aspect component supply operation.

7. The component mounting machine according to claim 4, wherein a cycle time of the second aspect component mounting operation is shorter than a cycle time of the first aspect component mounting operation.

8. The component mounting machine according to claim 4, wherein the second type of feeder transmits feeder information indicating that the feeder is the first type of feeder and performs the first aspect component supply operation when the first command is received by the second type of feeder from the component mounting machine.

* * * * *